United States Patent
Chu et al.

(10) Patent No.: US 11,858,850 B2
(45) Date of Patent: Jan. 2, 2024

(54) HIGH-STRENGTH ZIRCONIA-ALUMINA COMPOSITE CERAMIC SUBSTRATE APPLIED TO SEMICONDUCTOR DEVICE AND MANUFACTURING METHOD THEREOF

(71) Applicant: LEATEC FINE CERAMICS CO., LTD., Taoyuan (TW)

(72) Inventors: Chih-Hung Chu, Taoyuan (TW); Jui-Kai Wang, Taoyuan (TW)

(73) Assignee: LEATEC FINE CERAMICS CO., LTD., Taoyuan (TW)

( * ) Notice: Subject to any disclaimer, the term of this patent is extended or adjusted under 35 U.S.C. 154(b) by 662 days.

(21) Appl. No.: 16/928,035

(22) Filed: Jul. 14, 2020

(65) Prior Publication Data
US 2022/0017422 A1   Jan. 20, 2022

(51) Int. Cl.
*C04B 35/119* (2006.01)
*C04B 35/626* (2006.01)
(Continued)

(52) U.S. Cl.
CPC ........ *C04B 35/119* (2013.01); *C04B 35/6261* (2013.01); *C04B 35/6264* (2013.01); *C04B 35/6342* (2013.01); *C04B 35/64* (2013.01); *H01L 21/4807* (2013.01); *H01L 23/15* (2013.01); *C04B 2235/3206* (2013.01);
(Continued)

(58) Field of Classification Search
CPC ........... C04B 35/119; C04B 2235/6025; C04B 35/10–117
See application file for complete search history.

(56) References Cited

U.S. PATENT DOCUMENTS

| 4,917,842 | A | * | 4/1990 | Currie | ................. C04B 35/6264 |
|---|---|---|---|---|---|
| | | | | | 264/650 |
| 5,183,610 | A | * | 2/1993 | Brog | .................... C04B 35/119 |
| | | | | | 501/153 |

(Continued)

FOREIGN PATENT DOCUMENTS

CN       101304960 A * 11/2008   ......... C04B 35/2675

OTHER PUBLICATIONS

Richerson, David W. Modern Ceramic Engineering. New York, Marcel Decker, 1992. pp. 386-390, 471-477. (Year: 1992).*

(Continued)

*Primary Examiner* — Erin Snelting
(74) *Attorney, Agent, or Firm* — BACON & THOMAS, PLLC

(57) ABSTRACT

A high-strength zirconia-alumina composite ceramic substrate suitable for semiconductor devices has been invented. It is manufactured by a procedure starting with mixing powder formula of alumina, zirconia, and a self-made synthetic additive for ball milling in an organic solvent at room temperature. The resulting mixture is homogenously dispersed and is then subjected to the steps of slurry preparation, degassing, green embryo forming, punching, calculation, and sintering to yield the final composite ceramic substrate with an excellent mechanical property of three-point bending strength>600 MPa and superior thermoelectric properties of thermal conductivity>26 W/mK, insulation resistance>$10^{14}$ Ω·cm and surface leakage current (150° C.)<200 nA.

11 Claims, 1 Drawing Sheet

(51) Int. Cl.
  *C04B 35/634* (2006.01)
  *C04B 35/64* (2006.01)
  *H01L 21/48* (2006.01)
  *H01L 23/15* (2006.01)
(52) U.S. Cl.
  CPC ............... *C04B 2235/3208* (2013.01); *C04B 2235/3217* (2013.01); *C04B 2235/3246* (2013.01); *C04B 2235/3418* (2013.01); *C04B 2235/5436* (2013.01); *C04B 2235/5445* (2013.01); *C04B 2235/6025* (2013.01); *C04B 2235/612* (2013.01); *C04B 2235/661* (2013.01); *C04B 2235/9607* (2013.01)

(56) References Cited

U.S. PATENT DOCUMENTS

| | | | | |
|---|---|---|---|---|
| 5,853,514 A | * | 12/1998 | Takeuchi | ........... H10N 30/2047 |
| | | | | 264/618 |
| 2013/0240262 A1 | * | 9/2013 | Nagahiro | ............ C22C 32/0089 |
| | | | | 174/565 |

OTHER PUBLICATIONS

CN 101304960 A (Itoh) 2008-11-12 (English language machine translation). [online] [retrieved Apr. 20, 2023]. Retrieved from: Clarivate Analytics. (Year: 2008).*

* cited by examiner

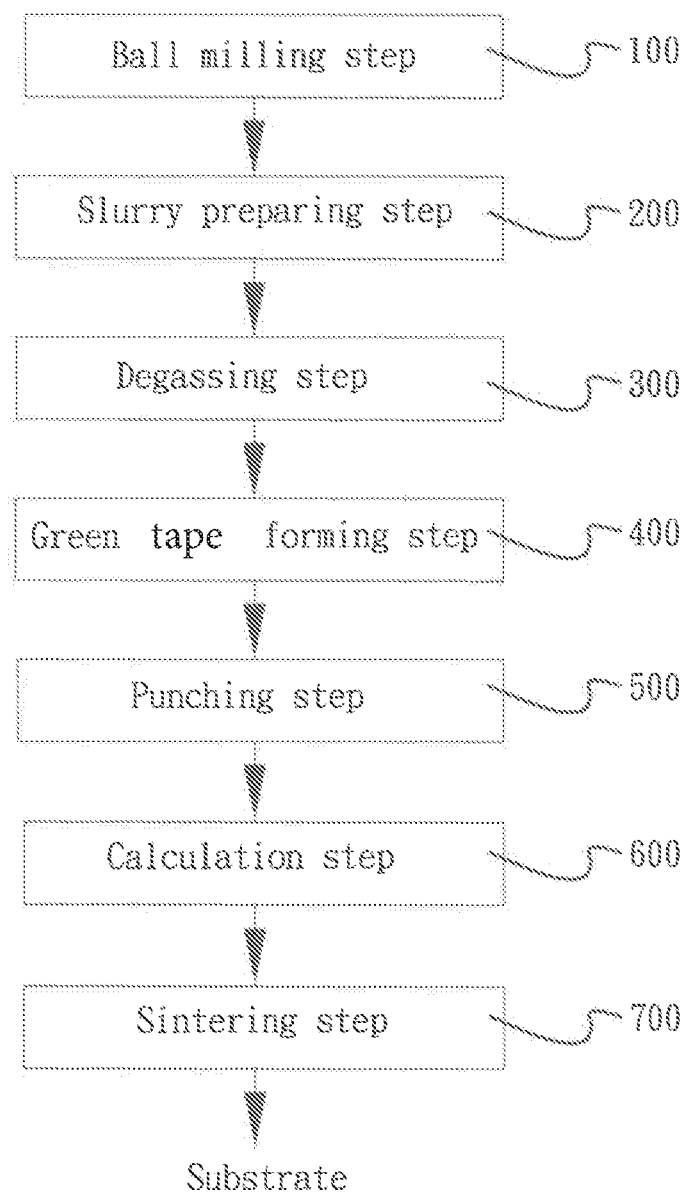

HIGH-STRENGTH ZIRCONIA-ALUMINA COMPOSITE CERAMIC SUBSTRATE APPLIED TO SEMICONDUCTOR DEVICE AND MANUFACTURING METHOD THEREOF

BACKGROUND OF THE INVENTION

Field of the Invention

The present invention relates to a zirconia-alumina composite ceramic substrate for semiconductor devices and its manufacturing method; in particular, it refers to a procedure by mixing alumina, zirconia, and self-made synthetic additive powders to obtain the alumina-zirconium substrate with a mechanical property of three-point flexural strength>600 Mpa and thermoelectric properties of thermal conductivity>26 W/mK, insulation resistance>$10^{14}$ Ω·cm, and low surface leakage current (150° C.)<200 nA.

Description of the Related Art

With the rapid development of electronic components, which substrates have clearly been required to become lighter, thinner, and shorter the long-time used alumina ceramic substrates, restricted by the mechanical strength characteristics, have gradually become unable to be satisfactory for practical uses.

A conventional alumina ceramic substrate is fabricated by sintering the alumina substances with a composition of alumina of 99.95% or higher purity and calcium oxide (Calcia) or magnesium oxide (Magnesia) of 100 ppm or less. However, following the development of thinning processes for large dimension devices, the mechanical strength of alumina ceramic substrates are evidently not enough to support subsequent operations such as sputtering, etching, and electroplating processes, or simply to meet the requirements for thinner components.

For a long time, alumina substrates have been widely used as insulating substrates for carrying semiconductor wafers, however, it can be considered that the demand for multi-operation semiconductors, semiconductor wafers often need to be charged with high voltage and high current, the traditional alumina substrates with lower mechanical strength and thermal conductivity are noted to not be beneficial for providing longer life time cycles, in particular, power module devices. Some manufacturers have proposed to dope certain kinds of additives such as zirconia and yttrium oxide to alumina and then the mixtures are sintered at high temperature, and they have claimed that the resulting substrate has a bending strength of 400 MPa. However, it is quite difficult for the substrate to achieve both high strength and high thermal conductivity at the same time. Usually, the high thermal conductivity substrate is obtained by grain growth of alumina sintered at higher temperature to reduce the grain boundary glass layer that causes thermal barriers. But, abnormal grain growth of alumina was accompanied with the higher sintering temperature, resulting in the drop of mechanical strength of alumina substrate.

In view of the above, the inventors have carried out a long-term research, and after numerous experiments, the invention has finally been produced.

SUMMARY OF THE INVENTION

The present invention aims to present a high-strength zirconia-alumina composite ceramic substrate suitable to be applied to semiconductor devices and its manufacturing method thereof, by mixing alumina ($Al_2O_3$), zirconia ($ZrO_2$) through a sintering aid (MCS) to form the zirconia-alumina composite ceramic substrate.

According to the high-strength zirconia-alumina composite ceramic substrate applied to semiconductor devices and its manufacturing method thereof the present invention, the obtained zirconia-alumina composite ceramic substrate includes a matrix phase formed by micrometer alumina particles, a reinforcement phase formed by submicron zirconia particles dispersed in the matrix phase, and a sintering additive synthesized in advance by calcination, and this is the next object of the present invention.

According to the high-strength zirconia-alumina composite ceramic substrate applied to semiconductor devices and its manufacturing method thereof the present invention, the zirconia particles dispersed in the matrix phase of alumina particles are composed of yttrium trioxide as a stabilizer in the crystalline phase of tetragonal zirconia, and this is another object of the present invention.

According to the high-strength zirconia-alumina composite ceramic substrate applied to semiconductor devices and its manufacturing method thereof the present invention, the sintering promotion additive is compounded from calcium oxide, silicon dioxide and magnesium oxide mixed in a certain ratio by bead milling and drying, and then synthesized silicon-magnesium-calcium compounds after calcination; by means of sintering additives to the zirconia-alumina composite ceramic material, the alumina particles shall contain a certain proportion of silicon-magnesium-calcium to lower zirconia-alumina composite ceramic sintering temperature and to improve the sintering microstructure uniformity, and this is another object of the present invention.

According to the high-strength zirconia-alumina composite ceramic substrate applied to semiconductor devices and its manufacturing method thereof the present invention, the obtained zirconia-alumina composite ceramic substrate have an excellent mechanical property of three-point bending strength>600 MPa and superior thermoelectric properties of thermal conductivity>26 W/mK, insulation resistance>$10^{14}$ Ω·cm, and low surface leakage current (150° C.)<200 nA, and this is also another object of the present invention.

The detailed structure, application principles, functions and effects of the present invention, shall become completely understandable after referring to the following description made in accordance with the drawings.

BRIEF DESCRIPTION OF THE DRAWINGS

FIG. 1 is a flowchart for manufacturing the zirconia-alumina composite ceramic substrate of the present invention.

DETAILED DESCRIPTION OF PREFERRED EMBODIMENT

According to the high-strength zirconia-alumina composite ceramic substrate applied to semiconductor devices and its manufacturing method thereof the present invention, the produced zirconia-alumina composite ceramic substrate is made of alumina ($Al_2O_3$), zirconia ($ZrO_2$) and pre-synthesized sintering additives (MCS).

As shown in FIG. 1, the manufacturing process of the high-strength zirconia-alumina composite ceramic substrate applied to semiconductor devices and its manufacturing method thereof the present invention includes:

Ball milling step 100: Using alumina with a powder particle size (D50) of 0.70 to 3.0 μm, zirconia with a powder particle size (D50) of 0.20 to 0.80 μm, and pre-synthesized sintering additives of staring powder with a powder particle size of (D50) 0.30~1.5 μm, is mixed with organic solvents by ball milling to achieve dispersion uniformly at room temperature;

Slurry preparing step 200: Preparing an alumina-based slurry by mixing alumina with addition of 1 to 15 wt. % zirconia and 0.01 to 5.0 wt. % a sintering promotion additives;

Degassing step 300: Degassing and defoaming the mixed slurry until the viscosity of the slurry reaches the pre-set range value of 8000~30000 cps;

Green tape forming step 400: Forming a green tape roll with a thickness of 0.12 to 1.10 mm by tape casting the mixed slurry with a viscosity of 8000 to 30000 cps;

Punching step 500: Punching the zirconia-aluminum composite green tape roll into sheets of pre-set size;

Calculation step 600: The outside diameter of 227×168 mm of the green sheet is obtained by pre-testing the sintering shrinkage rate to calculate the size of the punched green sheet;

Sintering step 700: The green sheets of 227×168 mm size are fired at a temperature of 1560-1660° C. in a conventional continuous tunnel furnace to obtain the zirconia-alumina composite ceramic substrate having the size of 7.5 inches× 5.5 inches and the thickness of 0.1-0.9 mm, preferably of 0.32 mm.

According to the high-strength zirconia-alumina composite ceramic substrate applied to semiconductor devices and its manufacturing method thereof the present invention, the obtained zirconia-alumina composite ceramic substrate includes a matrix phase formed by the micron alumina particles and the secondary phase formed the submicron zirconia particles dispersed on the matrix phase, and a sintering additive synthesized in advance by calcination. The matrix phase of alumina particles serves as the main phase, and the dispersed zirconia particles in the matrix are tetragonal zirconia crystals containing yttrium trioxide ($Y_2O_3$) as a stabilizer.

In the manufacturing process, the pre-synthesized additive is composed of calcium oxide, silicon dioxide and magnesium oxide in a certain proportion (for example, calcium oxide is 0.8~8.8 wt. %, silicon dioxide is 56.7~61.7 wt %, and magnesium oxide is 32.5~37.5 wt %), is used as feedstock. The starting materials are mixed by bead mill and dried, and then the precursor is fired at a temperature of 850~1250° C. to produce a silicon-magnesium-calcium oxide compound to ensure the less amount of 0.1 wt. % or more doping zirconia-alumina composite particles being surrounded with the certain proportion of silicon-magnesium-calcium oxides. Therefore, the function of pre-synthesized additive is noted to be beneficial for lowering sintering temperature for zirconia-alumina composite ceramics and enhancing the microstructural morphology uniformly.

According to the high-strength zirconia-alumina composite ceramic substrate applied to semiconductor devices and its manufacturing method thereof in the present invention, in the process for manufacturing the zirconia-alumina composite ceramic substrate, the self-prepared additive (MCS) can also be synthesized by combining calcium oxide, silica and magnesium oxide in a certain proportion by bead milling using zirconia beads as a mixing media. After mixing and drying, the powder mixture was obtained by calcining in furnace.

According to the high-strength zirconia-alumina composite ceramic substrate applied to a semiconductor devices and its manufacturing method thereof the present invention, the organic chemical binder comprises the solvent-based polyvinyl butyral (PVB), ether ester as the plasticizer, and an appropriate amount of surfactant as the dispersant.

|  | Alumina (wt. %) | Zirconia (wt. %) | MCS sintering promotion additives (wt. %) |
|---|---|---|---|
| Example 1 | 92.75 | 7 | 0.25 |
| Example 2 | 91.25 | 8.5 | 0.25 |
| Example 3 | 89.75 | 10 | 0.25 |
| Example 4 | 89.75 | 10 | 0 |
| Example 5 | 88.5 | 10 | 1.5 |

|  | Apparent density (gcm-3) | Three-point Bending strength (wt. %) | Thermal conductivity (W/mK) | High temperature surface leakage current (nA) |
|---|---|---|---|---|
| Example 1 | 4.044 | 633 | 28.0 | 0.170 |
| Example 2 | 4.064 | 649 | 28.1 | 0.169 |
| Example 3 | 4.125 | 661 | 26.7 | 0.113 |

According to the high-strength zirconia-alumina composite ceramic substrate applied to semiconductor devices of the present invention, the less amount of silicon magnesium calcium sintering additives is uniformly dispersed among alumina particles by means of the pre-synthesized procedure. It is noted that the silicon-magnesium-calcium compound is helpful for lowering the sintering temperature to avoid abnormal grain growth of alumina, resulting a decrease in strength. Besides, alumina grain boundaries are surrounded by the excessive glass phases, thus giving a lower thermal conductivity. Therefore, it should be pointed out that the produced zirconia-alumina composite ceramic substrate with adequate amount of sintering additives and temperature shall have the following properties:

1. Excellent three-point bending strength>600 MPa mechanical properties.
2. Thermal conductivity>26 W/mK.
3. Insulation resistance>$10^{14}$ Ω·cm.
4. Low surface leakage current (150° C.)<200 nA.

In summary, according to the high-strength zirconia-alumina composite ceramic substrate applied to semiconductor devices and its manufacturing method thereof the present invention, the characteristics of the zirconia-alumina composite ceramic substrate produced by the method are obviously superior than the traditional alumina ceramic substrate. The novel substrate is successfully satisfied with achieving the desired reliability for the post-substrate process operation and the required stability for the terminal devices. Therefore, the novel substrate along with its manufacturing method meet the conditions of the approvable patent.

The above description illustrates the preferred embodiment of the present invention. Any future alternative inventions as well as their effects deemed to be resulted from modifications of the above described invention should not be considered as new inventions, and thus the alternatives should belong to the present invention.

What is claimed is:

1. A method for manufacturing a zirconia-alumina composite ceramic substrate, comprising the following steps:

a ball milling step of mixing alumina, zirconia, and a sintering additive respectively by ball milling using organic solvents as a mixing medium at room temperature;

a slurry preparing step of preparing an alumina-based slurry mix in combination with the alumina, the zirconia, and the sintering additive according to a predetermined mass ratio;

a degassing step of degassing and defoaming said slurry mix until the viscosity of the slurry mix reaches a pre-set range value;

a green tape roll forming step of obtaining a green tape of a predetermined thickness by tape casting the slurry mix;

a calculation step of calculating a size of green sheets based on a pre-tested sintering shrinkage rate;

a punching step of punching the green tape roll into said green sheets of said calculated size;

a sintering step of sintering said green sheets of said calculated size into a zirconia-alumina composite ceramic substrate in a furnace, wherein the sintering additive is a pre-calcined synthetic sintering additive composed of calcium oxide, silicon dioxide and magnesium oxide in a ratio of calcium oxide 0.8 to 8.8 wt. %, silicon dioxide 56.7 to 61.7 wt. %, and magnesium oxide 32.5 to 37.5 wt. %, wherein the sintering additive is produced by mixing the calcium oxide, silicon dioxide and magnesium oxide by a bead mill to obtain a silicon-magnesium-calcium mixture; drying the silicon-magnesium-calcium mixture, and after the silicon-magnesium-calcium mixture is dried, calcining the silicon-magnesium-calcium mixture to produce a silicon-magnesium-calcium compound.

2. The method for manufacturing a zirconia-alumina composite ceramic substrate as set forth in claim 1, wherein a powder particle size (D50) of the alumina is 0.7 to 3.0 μm; a powder particle size (D50) of the zirconia is 0.2 to 0.8 μm; and a powder particle size (D50) of the sintering additive is 0.3 to 1.5 μm.

3. The method for manufacturing a zirconia-alumina composite ceramic substrate as set forth in claim 1, wherein said slurry mix comprises the zirconia with a weight percentage of 1 to 15 wt. %, the sintering additive with a weight percentage of 0.01 to 5.0 wt. %, and the rest is alumina.

4. The method for manufacturing a zirconia-alumina composite ceramic substrate as set forth in claim 3, wherein the viscosity of said degassed slurry mix is 8000 to 30000 cps.

5. The method for manufacturing a zirconia-alumina composite ceramic substrate as set forth in claim 1, wherein the green sheets have a size of 227×168 mm and the zirconia-alumina composite ceramic substrate is sintered from the green sheets at a temperature of 1560 to 1660° C.; such that the zirconia-alumina composite ceramic substrate has a size of 190.5×138 mm and a thickness of 0.1 to 0.9 mm.

6. The manufacturing method of a zirconia-alumina composite ceramic substrate applied to as set forth in claim 5, wherein the thickness of the zirconia-alumina composite ceramic substrate is 0.32 mm.

7. The manufacturing method of a zirconia-alumina composite ceramic substrate as set forth in claim 1, wherein the obtained zirconia-alumina composite ceramic substrate includes a matrix phase formed by alumina particles and a minor phase formed by submicron tetragonal crystalline zirconia particles dispersed in the matrix phase and the sintering additive; and the tetragonal crystalline zirconia particles dispersed in the matrix phase contain yttrium trioxide ($Y_2O_3$) as a stabilizer.

8. The manufacturing method of a zirconia-alumina composite ceramic substrate as set forth in claim 1, wherein the sintering additive is synthesized by mixing calcium oxide, silica and magnesium oxide in a certain proportion with zirconia beads for bead milling dispersion mixing, and the mixture of calcium oxide, silica and magnesium oxide is subjected to oven drying and subsequent furnace calcination synthesis.

9. The manufacturing method of a zirconia-alumina composite ceramic substrate as set forth in claim 1, wherein the slurry mix includes an organic chemical binder comprising a solvent-based polyvinyl butyral (PVB), ether ester as a plasticizer, and a surfactant as a dispersant.

10. A method for manufacturing a zirconia-alumina composite ceramic substrate, the manufacturing process including:

a ball milling step of using alumina with a powder particle size (D50) of 0.7-0.3 μm, zirconia with a powder particle size (D50) of 0.20-0.80 μm, and a pre-synthesized sintering additive with a powder size (D50) of 0.3 to 1.5 μm as starting powders for ball milling mixing and dispersion in an organic solvent at room temperature;

a slurry preparing step of preparing an alumina slurry mix with 1 to 15 wt. % of the zirconia, 0.01 to 5.0 wt. % of the sintering additive and the rest of the alumina;

a degassing step of degassing the slurry mix until a viscosity of the degassed slurry mix reaches a pre-set range of 8000 to 30000 cps;

a green tape forming step of casting the degassed slurry mix with the viscosity of 8000 to 30000 cps to form a zirconia-aluminum composite green tape roll with a thickness of 0.12 to 1.1 mm;

a punching step of punching the zirconia-aluminum composite green tape roll;

a calculation step of calculating size of a green sheet that is punched from the green tape roll based on a pre-tested sintering shrinkage rate to yield a punched green sheet with a size of 227×168 mm;

a sintering step of sintering said punched green sheet with a size of 227×168 mm through a furnace at a temperature of 1560 to 1660° C. and heating the punched green sheet with a size of 227×168 mm to form a zirconia-alumina composite substrate with a size of 190.5×138 mm and a thickness of 0.1 to 0.9 mm, wherein the sintering additive is a pre-calcined synthetic sintering additive composed of calcium oxide, silicon dioxide and magnesium oxide in a ratio of calcium oxide 0.8 to 8.8 wt. %, silicon dioxide 56.7 to 61.7 wt. %, and magnesium oxide 32.5 to 37.5 wt. %, wherein the sintering additive is produced by mixing the calcium oxide, silicon dioxide and magnesium oxide by a bead mill to obtain a silicon-magnesium-calcium mixture; drying the silicon-magnesium-calcium mixture, and after the silicon-magnesium-calcium mixture is dried, calcining the silicon-magnesium-calcium mixture to produce a silicon-magnesium-calcium compound.

11. A method for manufacturing a zirconia-alumina composite ceramic substrate as set forth in claim 10, wherein the thickness of the zirconia-alumina composite ceramic substrate obtained in the sintering step is 0.32 mm.

* * * * *